United States Patent
Thornton et al.

(10) Patent No.: US 6,372,356 B1
(45) Date of Patent: Apr. 16, 2002

(54) COMPLIANT SUBSTRATES FOR GROWING LATTICE MISMATCHED FILMS

(75) Inventors: Robert L. Thornton, Los Altos; Christopher L. Chua, San Jose, both of CA (US)

(73) Assignee: Xerox Corporation, Stamford, NY (US)

( * ) Notice: Subject to any disclaimer, the term of this patent is extended or adjusted under 35 U.S.C. 154(b) by 0 days.

(21) Appl. No.: 09/559,828

(22) Filed: Apr. 28, 2000

Related U.S. Application Data

(63) Continuation-in-part of application No. 09/090,344, filed on Jun. 4, 1998, now abandoned.

(51) Int. Cl.⁷ .................. B32B 15/04; H01L 21/3205
(52) U.S. Cl. .................. 428/469; 428/332; 428/697; 428/698; 428/699; 428/701; 438/604; 438/626; 438/607; 257/189; 257/200; 257/190; 257/194; 257/918
(58) Field of Search .................. 428/620, 642, 428/469, 697, 698, 699, 701, 332; 257/183, 187, 189, 190, 192, 200, 918; 438/604, 606, 607

(56) References Cited

U.S. PATENT DOCUMENTS

| | | | |
|---|---|---|---|
| 4,876,219 A | * 10/1989 | Eshita et al. | 437/126 |
| 5,300,320 A | 4/1994 | Barron et al. | 427/249 |
| 5,486,857 A | 1/1996 | Smith et al. | 347/224 |
| 5,498,595 A | 3/1996 | Eccleston | 505/235 |
| 5,506,420 A | 4/1996 | Kossovsky et al. | 257/40 |
| 5,617,446 A | * 4/1997 | Ishibashi et al. | 372/96 |
| 5,633,516 A | * 5/1997 | Mishima et al. | 257/190 |
| 5,661,112 A | 8/1997 | Hatta et al. | 505/233 |
| 5,780,163 A | 7/1998 | Camilletti et al. | 428/446 |
| 5,824,418 A | 10/1998 | Tully et al. | 428/426 |
| 5,841,156 A | * 11/1998 | Kajikawa et al. | 257/183 |
| 5,883,911 A | * 3/1999 | Lee et al. | 372/45 |
| 5,903,017 A | * 5/1999 | Itaya et al. | 257/190 |
| 6,072,202 A | * 6/2000 | Naniwae | 257/190 |

FOREIGN PATENT DOCUMENTS

JP 408125223 A * 5/1996

OTHER PUBLICATIONS

A.R. Powell, S.S. Iyer and F.K. LeGoues, "New Approach to the Growth of Low Dislocation Relaxed SiGe Material", Appl. Phys. Lett. 64 (14), pp. 1856–1858, 1994.

C.L. Chura, W.Y. Hsu, C.H. Lin, G. Christenson, and Y.H. Lo, "Overcoming the pseudomorphic critical thickness limit using compliant substrates," Appl. Phys. Lett., vol. 64 (26), pp. 3640–3642, 1994.

L.B. Freund and W.D. Nix, "A critical thickness condition for a strained compliant substrate/epitaxial film system," Appl. Phys. Lett., vol. 69 (2), pp. 173–175, 1996.

(List continued on next page.)

*Primary Examiner*—Deborah Jones
*Assistant Examiner*—Stephen Stein
(74) *Attorney, Agent, or Firm*—Oliff & Berridge, PLC

(57) ABSTRACT

Compliant substrates include a compliant single crystal layer formed on an amorphous buffer layer, which is formed on a single crystal base layer. The compliant single crystal layer can be used as a template to support the growth of one or more lattice mismatched layers on the compliant substrate. Various electronic and optoelectronic devices including, for example, photodetectors, long-wavelength semiconductor light-emitting devices, short-wavelength semiconductor light-emitting devices, optical modulators and transistors, can be formed on the compliant substrates. The compliant substrates can be produced by epitaxially forming an intermediate single crystal layer, that can be treated to convert it to an amorphous layer, between two single crystal layers, and treating the intermediate single crystal layer to form an amorphous buffer layer.

43 Claims, 4 Drawing Sheets

OTHER PUBLICATIONS

F.E. Ejeckam, Y. Qian, Z.H. Zhu, Y.H. Lo, S. Subramanian, and S.L. Sass, "Misaligned (or twist) wafer–bonding: a new technology for making III–V compliant substrates," LEOS '96, Boston, MA, paper ThK2, 1996, pp. 352–353.

A. Black, A.R. Hawkins, N.M. Margalit, D.I. Babic, A.L. Holmes, Jr., Y.L. Chang, P. Abrahams, J.E. Bowers, and E.L. Hu, "Wafer Fusion: Materials Issues and Device Results," IEEE Journal of Selected Topics in Quantum Electronics, vol. 3, No. 3, pp. 943–951, 1997.

C.L. Chua, W.Y. Hsu, F. Ejeckam, A. Tran, and Y.H. Lo, "Growing Pseudomorphic Layers Beyond the Critical Thickness Using Free–Standing Compliant Substrates," Mat. Res. Soc. Symp. Proc. vol. 326, pp. 21–26, 1994.

* cited by examiner

COMPLIANT SUBSTRATES FOR GROWING LATTICE MISMATCHED FILMS

This is a Continuation-in-Part of application Ser. No. 09/090,344 filed Jun. 4, 1998, now abandoned.

BACKGROUND OF THE INVENTION

1. Field of Invention

This invention relates to compliant substrates that can be used as templates for epitaxial growth. This invention also relates to semiconductor structures including electronic and optoelectronic devices formed on the compliant substrates. This invention further relates to processes for forming the compliant substrates and the semiconductor structures.

2. Description of Related Art

Pseudomorphic epitaxy involves the epitaxial growth of high-quality single crystal thin films on lattice-mismatched substrates. Pseudomorphic epitaxy has found many applications. For example, high-performance lasers utilizing strained InGaAsP quantum wells have been fabricated on InP for telecommunications applications. Unfortunately, lattice-mismatched films cannot be grown beyond their "critical thickness" limit, which decreases with increasing lattice mismatch, without generating misfit dislocations that seriously impair the performance of devices made from the films. For structures that require thick layers of lattice-mismatched films, such as strained p-i-n photodetectors, a specially prepared substrate must be developed on which to grow the films.

Compliant substrates, that have sufficient mechanical flexibility to comply to the lattice parameter of an epitaxial layer grown on them, have been proposed as a possible solution for growing lattice mismatched films such as GaN on GaAs. In this scheme, the substrate is made to accommodate the lattice preference of the film grown above it, rather than the reverse roles that characterizes typical epitaxial growth. Previous ideas for realizing compliant substrates include using thin, free-standing GaAs membranes, thin silicon films bonded to another substrate through a $SiO_2$ intermediate layer, and intentionally misaligned wafer-fused III–V films. See, for example, *Appl. Phys. Lett.*, vol. 64(14), pp. 1856–1858, 1994; *Appl. Phys. Lett.*, vol. 64(26), pp. 3640–3642, 1994; *Appl. Phys. Lett.*, vol. 69(2), pp. 173–175, 1996; and LEOS '96, Boston, Mass., paper ThK2, 1996, which are each incorporated herein by reference in their entirety.

Although freestanding membranes are useful for demonstrating the concept of compliant substrates, they are too fragile for practical use.

Wafer bonded films have recently shown great promise as compliant substrates; however, they require cumbersome wafer-bonding and substrate removal steps to fabricate them. See, for example, *IEEE J. Quantum Elect.*, vol. 3, pp. 943–951, 1997, which is incorporated herein by reference in its entirety.

SUMMARY OF THE INVENTION

This invention provides compliant substrates that overcome the above-described problems of known compliant substrates.

This invention separately provides semiconductor structures comprising devices formed on the compliant substrates.

This invention also separately provides processes for forming the compliant substrates.

This invention further provides processes for forming the semiconductor structures.

Exemplary embodiments of the compliant substrates according to this invention comprise a first single crystal layer; an amorphous buffer layer on the first single crystal layer; and a second single crystal layer on the amorphous buffer layer. The second single crystal layer is compliant and able to mechanically deform, or comply, to match the lattice parameter of an epitaxial film grown on the second single crystal layer. III–V materials can be used to form the compliant substrates.

Exemplary embodiments of the semiconductor structures according to this invention can comprise various electronic and optoelectronic devices, that include lattice mismatched single crystal layers, formed on the compliant substrates.

Exemplary embodiments of the processes for forming the compliant substrates according to this invention comprise growing an epitaxial laminate of an intermediate single crystal layer between a thin single crystal layer and another single crystal layer. The intermediate single crystal layer is then treated so that it forms an amorphous buffer layer. The formation of the amorphous buffer layer partially "releases" the thin single crystal layer, so that it can comply with an epitaxial film grown on the thin single crystal layer.

BRIEF DESCRIPTION OF THE DRAWINGS

Preferred embodiments of this invention will be described in detail, with reference to the following figures, wherein.

DETAILED DESCRIPTION OF PREFERRED EMBODIMENTS

Figure 1A:
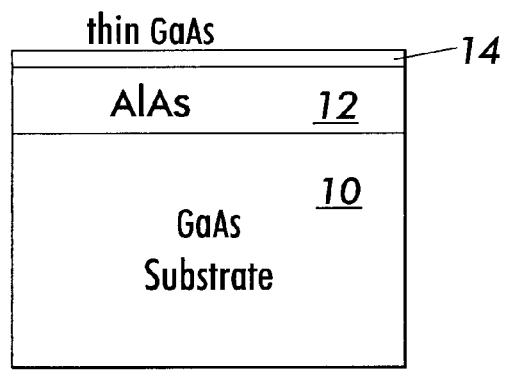
FIGS. 1A–1C are cross-sectional schematic views illustrating steps used in fabricating a compliant substrate according to an exemplary embodiment of the processes of this invention.

Exemplary embodiments of the compliant substrates according to this invention include a first single crystal layer; an amorphous buffer layer on the first single crystal layer; and a compliant second single crystal layer on the amorphous buffer layer.

The first single crystal layer can be composed of an element or, alternatively, from a compound or alloy formed from two or more different elements. The first single crystal layer can comprise any suitable material, including, but not limited to, GaAs, Si, InP and the like. In embodiments in which the compliant substrate is to be used to grow GaN, GaAs is the preferred material of the first single crystal layer.

In exemplary embodiments, the first single crystal layer can have any desirable thickness, depending on the intended use of the compliant substrate. For example, the first single crystal layer can typically have a thickness between about 50 μm and 2 mm.

The amorphous buffer layer can comprise an oxidized epitaxial layer. For example, the amorphous buffer layer can comprise oxidized AlAs, oxidized AlGaAs, oxidized AlInP and oxidized AlAsSb. In exemplary embodiments of this invention, the amorphous buffer layer can comprise any suitable oxidized material that is sufficiently lattice matched to both the first and second single crystal layers. Suitable exemplary materials for forming the amorphous buffer layer that meet these criteria include, but are not limited to, AlAs, AlGaAs, AlGaAsSb and AlGaInP.

The buffer layer must have a sufficient thickness (typically at least several nanometers) in order to form a continuous layer. There is no particular upper limit on the thickness of the amorphous buffer layer. The amorphous buffer layer can typically have a thickness of from about 20 nm to about 1000 nm.

The second single crystal layer can be composed of an element or, alternatively, from a compound or alloy formed from two or more elements. For example, the second single crystal layer can be a III–V compound semiconductor. The term "III–V compound" as used herein refers to compounds and alloys formed from at least one element from Group III of the periodic table and at least one element from Group V of the periodic table. Exemplary suitable III–V compounds include, for example, GaAs, InGaAs and GaInP. In embodiments of this invention in which the compliant substrate is intended to be used as a substrate to grow GaN, GaAs is the preferred material of the second single crystal layer.

The second single crystal layer preferably must be thick enough to provide sufficient coverage of the amorphous buffer layer. Preferably, the second single crystal layer forms a continuous layer on the amorphous buffer layer so that the entire bottom surface of the second single crystal layer contacts with, and is fully supported by, the amorphous buffer layer.

The second single crystal layer also preferably must be thin enough to comply or stretch in response to stress being imparted to it by a film being deposited on the second single crystal layer. In some preferred embodiments, the second single crystal layer is no thicker than a desired thickness, which is related to the "critical thickness" of the second single crystal layer. As used herein, the "critical thickness" of the second single crystal layer is the thickness below which the energy associated with strain in the second single crystal layer is sufficiently low that it does not force defects into a layer grown epitaxially on the second single crystal layer. In other words, the energy required to deform or to generate defects in the second single crystal layer is less than the energy required to form defects in the epitaxial layer grown on the second single crystal layer. Consequently, defects that may be generated grow downward and not upward into the epitaxially grown layer on the second single crystal layer.

The critical thickness of the second single crystal layer depends on the magnitude of the lattice mismatch between the second single crystal layer and the epitaxial layer grown on the second single crystal layer. Thus, the maximum permissible thickness of the second single crystal layers varies depending on the composition of the second single crystal layer, the composition of the epitaxial layer grown on it, and the corresponding magnitude of the lattice mismatch between the second single crystal layer and the epitaxial layer.

This maximum permissible thickness decreases with increasing lattice mismatch because the strain energy increases faster with layer thickness for larger lattice mismatch. The maximum permissible thickness also depends on the growth conditions of the lattice mismatched epitaxial layer. Lower growth temperatures and higher growth rates relax the maximum thickness requirement and allow a thicker second crystal layer. A lower temperature is favorable because it slows the multiplication of dislocations during growth, while faster growth reduces the time needed to grow the epitaxial layer. A calculated relationship between the maximum permissible thickness of the second crystal layer and the lattice mismatch can be found in C. L. Chua, et. al., "Growing pseudomorphic layers beyond the critical thickness using free-standing compliant substrates in Growth, Processing, and Characterization of Semiconductor Heterostructure," Mat. Res. Soc. Symp. Proc. vol. 326, p. 21–26 (1994), which is incorporated herein by reference in its entirety.

In some preferred embodiments of the compliant substrates of this invention, the second single crystal layer has a thickness, t, that is no greater than the critical thickness, $t_{crit}$, (i.e., $t \leq t_{crit}$). By keeping the second single crystal layer thickness no greater than the critical thickness, the second single crystal layer can be expected to comply or stretch in response to stress being imparted to it by a film deposited on it.

However, although less preferred, in some exemplary embodiments of the compliant substrates of this invention, the second single crystal layer can have a thickness, t, up to about fifteen times the critical thickness, $t_{crit}$, (i.e., $t \leq 15$ $t_{crit}$). Such embodiments provide a higher thickness tolerance, which can simplify the process of forming the compliant substrates.

For example, to reduce, or even substantially minimize, the formation of defects in epitaxial films grown on a compliant GaAs second single crystal layer, the GaAs layer should preferably have a thickness between about 2 nm and about 20 nm. However, in some embodiments, the GaAs layer can have a thickness of up to about 300 nm. Of course, the present invention is not limited to these thicknesses, and other thicknesses can be used, if desired.

As stated above, this invention also provides processes for forming the above-described compliant substrates that comprise an amorphous buffer layer disposed between the first and second single crystal layers. Exemplary embodiments of the processes according to this invention include providing a first single crystal layer; forming an intermediate single crystal layer on the first single crystal layer; forming a second single crystal layer on the intermediate single crystal layer; and forming an amorphous buffer layer from the intermediate single crystal layer.

As stated above, the second single crystal layer should preferably have a thickness, t, that is no greater than fifteen times the critical thickness, $t_{crit}$, (i.e., $t \leq 15$ $t_{crit}$). As also stated above, in some exemplary preferred embodiments of the compliant substrates of this invention, the thickness of the second single crystal layer is no greater than the critical thickness for reducing, or even substantially preventing, defect formation in epitaxial films grown on the second single crystal layer.

In some exemplary embodiments of the processes of this invention, the amorphous buffer layer can be formed from the intermediate single crystal layer by first forming a trench (i.e., trenching) through the second single crystal layer and exposing the intermediate single crystal layer. After the trench is formed, the intermediate single crystal layer can be oxidized to form the amorphous buffer layer.

The intermediate single crystal layer can be converted to amorphous material using any suitable process. In some exemplary processes, although the present invention is not limited thereto, the intermediate single crystal layer is oxidixed by exposing it to any suitable oxygen-containing gas in an oxidation process. For example, the oxygen-containing gas can be a nitrogen gas bubbled through heated water or steam. Other suitable exemplary processes for oxidizing the intermediate single crystal layer include, for example, dry $O_2$ oxidation and anodic oxidation.

For example, steam in flowing nitrogen can be used as the oxygen-containing gas for oxidizing AlAs single crystal layers. An ambient temperature of from about 380° C. to about 550°C. can typically be used to oxidize the AlAs and form an amorphous buffer layer. The oxidation rate of AlAs in steam varies depending upon the ambient temperature and the composition of the AlAs. The oxidation rate increases with increasing temperature. For example, the presence of small amounts of gallium in the aluminum arsenide tends to inhibit the oxidation. That is, for $Al_xGa_{1-x}As$, (where x is from 0 to 1), as x increases and the aluminum content accordingly increases, the oxidation rate of the $Al_xGa_{1-x}As$ increases. Steam has a minimal effect on pure GaAs. However, a 100 nm thick AlAs layer free of Ga (i.e., x=1), sandwiched between inert single crystal layers, oxidizes laterally at a rate of about 1 $\mu$m/min. For an amorphous buffer layer having a typical length and width of from about 100 $\mu$m to about 200 $\mu$m, the buffer layer can typically be sufficiently oxidized in less than about one hour.

Most GaN-based devices are currently fabricated on III–V films grown on substrates such as sapphire and SiC. These substrates have a large lattice mismatch with GaN. Consequently, films with low defect densities are difficult to grow and devices that are produced on these substrates exhibit poor performance.

Figure 1B:
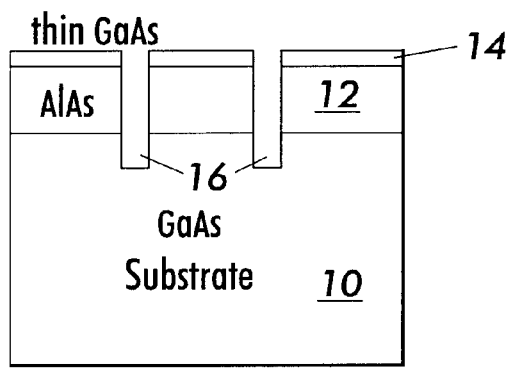
Figure 1C:
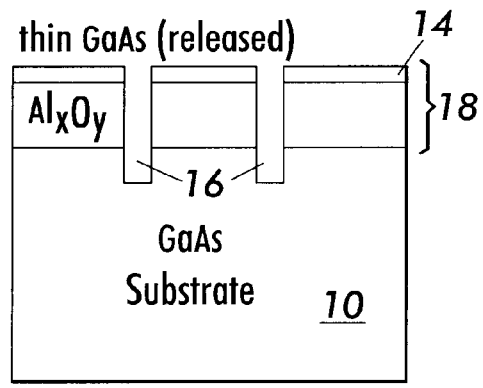

GaAs substrates, such as shown in FIGS. 1A–1C, are attractive because, unlike sapphire, they can be readily cleaved along certain crystal orientations to form laser facets. In addition, GaAs substrates can be easily etched using standard chemical etching techniques, thereby increasing process flexibility. Thus, compliant substrates formed on GaAs wafers in accordance with this invention can be more easily processed than can conventional substrates for GaN-based devices.

An exemplary embodiment of the processes for forming the compliant substrates according to this invention is shown in FIGS. 1A–1C. FIG. 1A shows an AlAs intermediate single crystal layer 12 on a GaAs wafer substrate, which forms a first single crystal layer 10. A thin GaAs second single crystal layer 14 is formed on top of the AlAs intermediate single crystal layer 12. As shown, the GaAs second single crystal layer 14 forms a continuous layer on the AlAs intermediate single crystal layer 12. Both the AlAs intermediate single crystal layer 12 and the thin GaAs second single crystal layer 14 are first grown on the GaAs first single crystal layer 10 by any suitable epitaxial deposition technique. For example, the AlAs intermediate single crystal layer 12 and the thin GaAs second single crystal layer 14 can be grown on the GaAs first single crystal layer 10 by metal organic chemical vapor deposition (MOCVD), molecular beam epitaxy (MBE), or any other suitable method.

As shown in FIG. 1B, to oxidize the intermediate single crystal layer 12, trenches 16 can be formed through the thin GaAs second crystal layer 14 to expose the AlAs intermediate single crystal layer 12. The trenches 16 can be formed, for example, by patterning narrow openings in photoresist on the surface of the thin GaAs second single crystal layer 14, so that portions of the thin GaAs second single crystal layer 14 are not covered by resist, and then etching through the thin GaAs second single crystal layer 14 to the AlAs intermediate single crystal layer 12 using any suitable etching technique. For example, conventional reactive ion etching (RIE) can be used to etch the trenches, leaving separated mesas 18.

Next, the AlAs intermediate single crystal buffer layer 12 is selectively wet oxidized in the lateral direction until it is completely converted into an amorphous buffer layer 20. The amorphous buffer layer 20 formed by treating the AlAs intermediate single crystal layer 12 comprises aluminum oxide ($Al_xO_y$). This oxidation process partially "releases" the thin GaAs second single crystal layer 14 from the amorphous buffer layer 20, so that these layers are only weakly bonded to each other. As a result of the oxidation process, the GaAs second single crystal layer 14 has the mechanical flexibility that is characteristic of compliant substrates.

Optimization of the adhesion properties of the thin GaAs second single crystal layer 14 to the amorphous buffer layer 20 can be accomplished by appropriately grading the composition of an intermediate single crystal layer 12 comprising $Al_xGa_{1-x}As$ and the thin GaAs second single crystal layer 14 prior to oxidizing the intermediate single crystal layer 12 to form the amorphous structure of the amorphous buffer layer 20. When graded, the aluminum content, x, can be varied typically between 1 and about 0.8 at different distances from the second single crystal layer 14.

Figure 2:
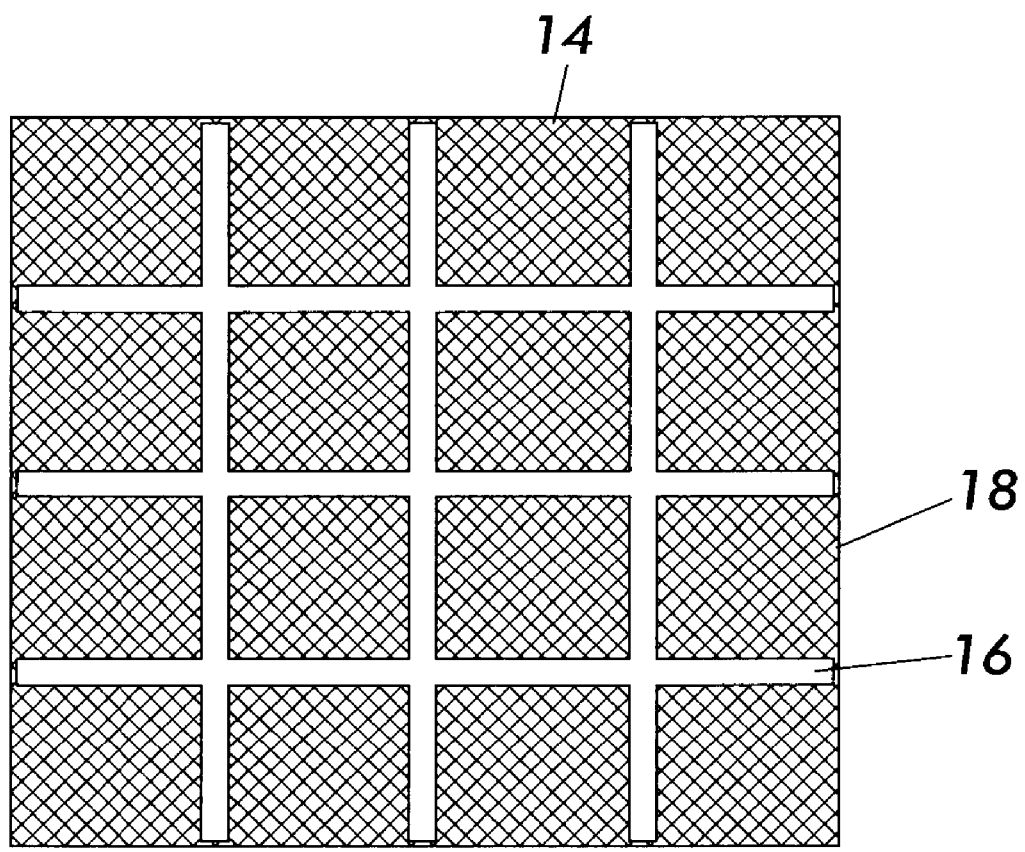
FIG. 2 is a plan view of an exemplary embodiment of a compliant substrate according to this invention.

FIG. 2 shows a plan view of the wafer formed by the exemplary process shown in FIGS. 1A–1C. Intersecting trenches 16 separate mesas 18 from each other. Each mesa 18 includes a partially "released" thin GaAs second single crystal layer 14 forming a surface layer.

Once the thin GaAs second single crystal layer 14 is partially "released" from the underlying amorphous buffer layer 20, one or more lattice mismatched films can be grown on the thin GaAs second single crystal layer 14. Because the partially released thin GaAs second single crystal layer 14 has a certain thickness, this layer can comply, or deform, under an epitaxial film grown on the GaAs single crystal layer, so as to match the lattice parameter of the overlying epitaxial film. The deformation of the thin GaAs second single crystal layer 14 minimizes the creation of defects in the overlying epitaxial film, resulting in high-quality epitaxial film material.

The weak bonding between the amorphous buffer layer 20 and the second single crystal layer 14 of the compliant substrates enables layers of materials that are not lattice matched to the second single crystal layer 14 material (i.e., lattice mismatched layers) to be formed on the compliant substrates. As these lattice mismatched layers grow, the second single crystal layer 14 can deform and allow any defects (dislocations) that may be generated to grow downward and not upward into the lattice mismatched layers. Consequently, high-quality epitaxial films composed of certain materials can be successfully grown on the compliant substrates of this invention, where these same films previously could not be successfully grown on substrates formed from the same materials as the compliant substrates. The ability of the compliant substrates of this invention to deform as necessary to accommodate the magnitude of the lattice mismatch between the compliant layers and layers formed on the compliant substrates allows these epitaxial films, and thus also semiconductor structures including the epitaxial films, to be formed on the compliant substrates.

In addition, lattice mismatched layers of increased thickness can be grown on the compliant substrates according to this invention, due to the ability of the compliant layers to deform during the growth of the lattice mismatched films. The thicker layers can improve the performance of various electronic and optoelectronic devices as described below.

Consequently, the compliant substrates according to this invention can be used as templates for the growth of epitaxial films and semiconductor structures that could not previously be successfully formed on the same materials that can form the compliant substrates, and also that include layers that are thicker than those that could previously be grown on substrates.

As stated above, this invention provides semiconductor structures formed on the compliant substrates. The semiconductor structures include one or more substantially lattice mismatched single crystal layers formed on the second single crystal layer 14 (compliant layer) of the compliant substrate.

Exemplary lattice mismatched film compositions that can be grown on the compliant layers of the compliant substrates of this invention include, for example, but are not limited to, InAlGaAsN, InAlGaAsP, InAlGaAsSb and the like. In any one these and other suitable compounds, the amount of each Group III or Group V element, relative to other Group III or Group V elements in the respective compound, can range from 0% to 100%.

Figure 3:
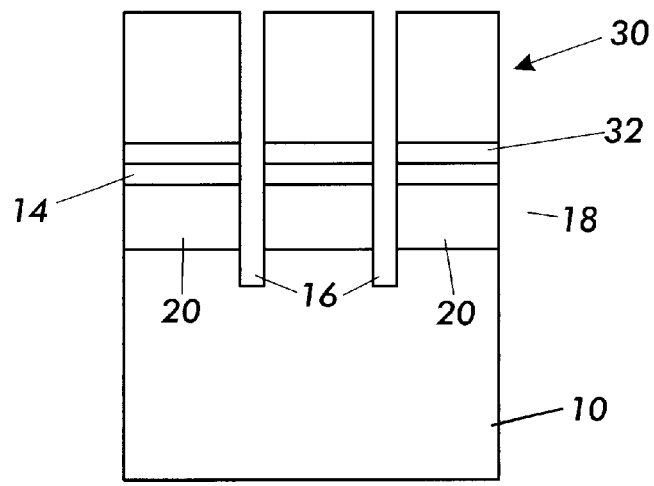
FIG. 3 illustrates an exemplary embodiment of a semiconductor structure according to this invention including one or more lattice mismatched single crystal layers formed on the compliant substrate of FIG. 1C.

FIG. 3 illustrates an exemplary semiconductor structures 30 formed on the compliant substrate shown in FIG. 1C. The semiconductor structure 30 includes at least one lattice mismatched layer 32 formed on the second single crystal layer 14 of the compliant substrate. The semiconductor substrates can comprise various electronic and optoelectronic devices including, for example, photodetectors, multiple quantum well optical modulators, semiconductor lasers, transistors and light emitting diodes (LEDs).

For example, highly-strained p-i-n photodetectors comprising an intrinsic semiconductor layer sandwiched between an n-type semiconductor layer and a p-type semiconductor layer can be formed on the compliant substrates of this invention.

Figure 4:
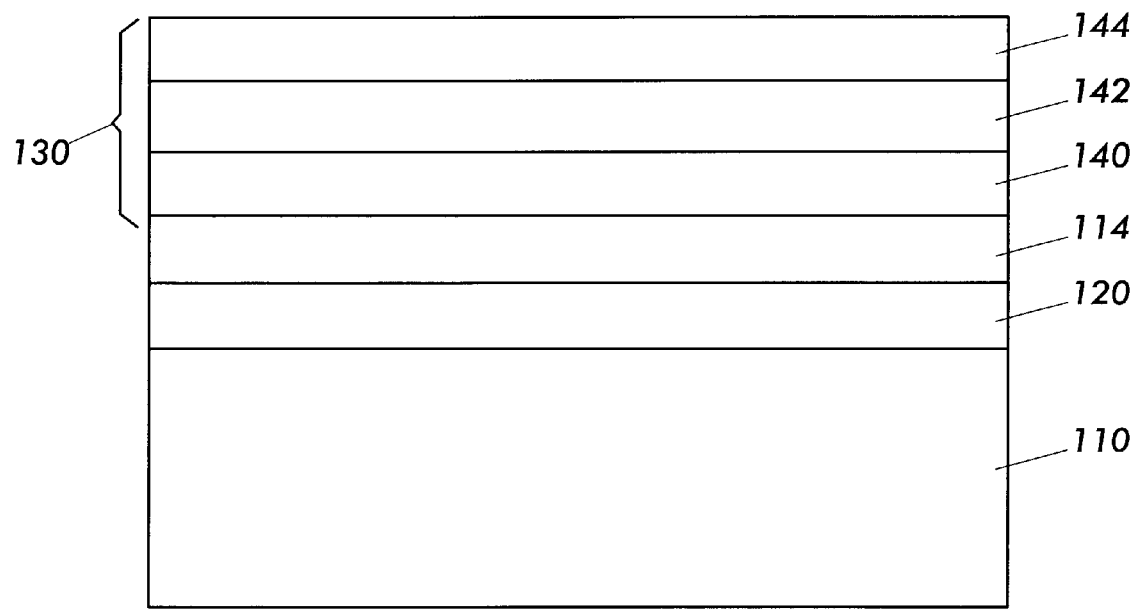
FIG. 4 illustrates an exemplary embodiment of a semiconductor structure including a p-i-n photodetector grown on a compliant substrate according to this invention.

FIG. 4 shows an exemplary highly-strained p-i-n photodetector 130 comprising an intrinsic $In_{0.14}Ga_{0.86}As$ layer 142 sandwiched between an n-type $In_{0.14}Ga_{0.86}As$ layer 140 formed on a GaAs compliant layer 114 of the compliant substrate, and a p-type $In_{0.14}Ga_{0.86}As$ layer 144. Other material compositions for the layers of the p-i-n photodetector 130 can also be used.

The p-i-n photodetectors, such as the p-i-n photodetector 130, can comprise thick layers of strained absorbing material. Such photodetectors containing thick strained layers could not previously be grown above a certain thickness without inducing substantial crystal defects. A thick absorbing region is essential for providing good photodetector sensitivity, which is desirable because it produces a large signal for a given detected light intensity.

For example, in the p-i-n photodetector 130, the n-type $In_{0.14}Ga_{0.86}As$ layer 140, the intrinsic $In_{0.14}Ga_{0.86}As$ layer 142, and the p-type $In_{0.14}Ga_{0.86}As$ layer 144 can each be about 1 $\mu$m thick. The composite structure can comprise a 1% strained photodetector on GaAs.

As stated above, the compliant substrates of this invention can also be used as substrates for growing long-wavelength semiconductor light-emitting devices, such as long-wavelength semiconductor lasers and light-emitting diodes. Such semiconductor light-emitting devices emit at a wavelength of from about 1.1 $\mu$m to about 2 $\mu$m. For example, InP-based long-wavelength semiconductor lasers can be grown on GaAs compliant substrates according to this invention.

The ability to integrate InP-based laser materials on GaAs compliant substrates provides increased flexibility in the device structures because GaAs-based epi layers, that are not normally available to InP-based systems, can be incorporated in the structures. For example, long-wavelength, vertical-cavity, surface-emitting lasers require a low band-gap light-emitting material. Such materials can be realized using InP-based epi-layers. However, these lasers also need a highly reflective mirror that is very difficult to form using InP-based materials. Using the compliant substrates of this invention, however, the InP-based light-emitting region can be integrated with GaAs-based mirrors, which have a higher reflectivity and a wider reflectivity bandwidth than their InP-based counterparts.

Figure 5:
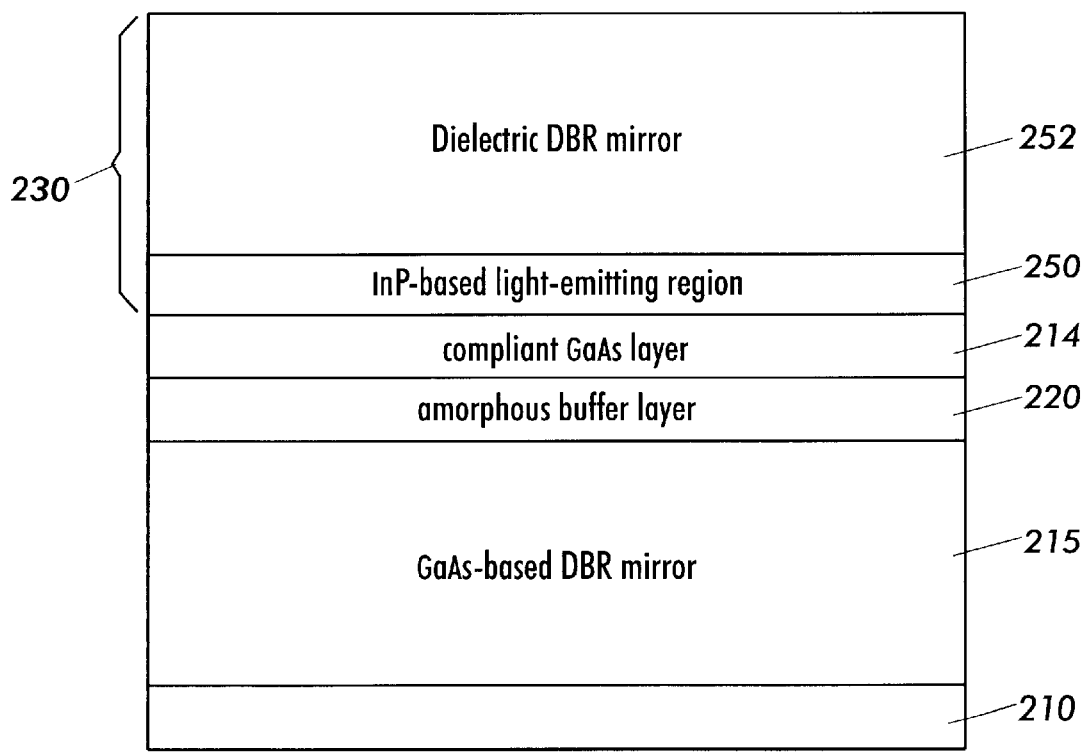
FIG. 5 illustrates an exemplary embodiment of a semiconductor structure including a long-wavelength semiconductor light-emitting device grown on a compliant substrate according to this invention.

An exemplary semiconductor structure including a long-wavelength semiconductor laser 230 is shown in FIG. 5. The semiconductor structure comprises a GaAs-based distributed bragg reflector (DBR) mirror 215 grown on a GaAs substrate 210 and typically includes about thirty-five pairs of quarter-wavelength thick alternating layers of AlAs/GaAs. An InP-based light-emitting region 250 is formed on a compliant GaAs layer 214. The InP-based light-emitting region includes an InGaAsP multiple quantum well region including material compositions that can emit light at a wavelength of 1.55 microns. A dielectric DBR mirror 252 is formed on the InP-based light-emitting region 250. The dielectric DBR mirror 252 typically comprises four pairs of quarter-wavelength thick alternating layers of $Si/SiO_2$, which can be formed by any suitable process such as electron-beam evaporation.

As stated above, another application for the compliant substrates of this invention is in short-wavelength semiconductor light-emitting devices, including lasers and light-emitting diodes. These light-emitting devices emit at a wavelength of less than about 600 nm and include yellow light emitting devices (i.e., devices emitting at a wavelength of from about 570–590 nm) and blue light emitting devices (i.e., lasers and LEDs emitting at a wavelength of from about 450–490 nm). Short-wavelength semiconductor light-emitting devices including thick, highly strained epitaxial films can be grown on compliant substrates according to this invention.

For example, GaN can be grown on the compliant substrates of this invention. The thin GaAs second single crystal layer 14 can minimize the creation of defects in such expitaxial GaN films, resulting in the formation of high-quality GaN material. Low-defect GaN is particularly well suited for fabricating high-quality light emitting devices that emit blue light.

Figure 6:
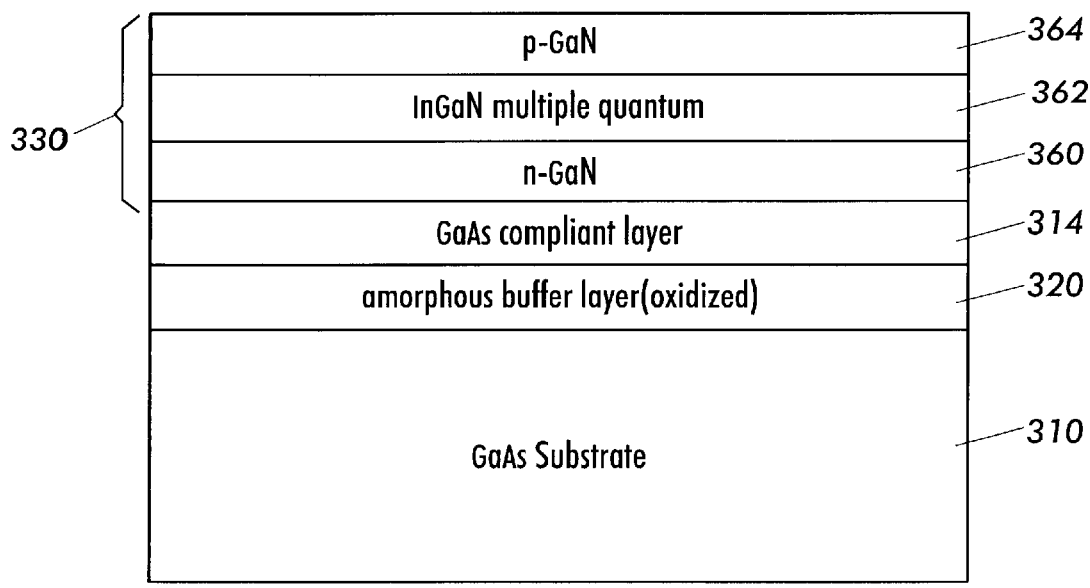
FIG. 6 illustrates an exemplary embodiment of a semiconductor structure including a short-wavelength semiconductor light-emitting device grown on a compliant substrate according to this invention.

An exemplary embodiment of a semiconductor structure including a semiconductor short-wavelength light-emitting device 330 including GaN-based epitaxial layers is shown in FIG. 6. The light-emitting device 330 comprises an n-GaN layer 360 grown on a GaAs compliant layer 314 of a compliant substrate, an InGaN multiple quantum well region 362 formed on the n-GaN layer 360, and a p-GaN layer 364 formed on the InGaN multiple quantum well region 362.

The compliant substrates of this invention can also be used in optoelectronic integration applications. For example, GaN devices can be formed on GaAs containing GaAs-based devices to make multiple-wavelength emitting light sources. Such multiple-wavelength light sources can be used, for example, in high speed printing where each wavelength encodes a separate data stream.

InP-based devices can also be integrated with GaAs-based transistors using the compliant substrates of this invention, providing increased device design flexibility.

Thus, this invention provides compliant substrates that include single crystal layers that are compliant and able to mechanically deform, or comply, to match the lattice parameter of epitaxial films grown on them. The compliant substrates can be formed from various materials, including III–V compound materials, using conventional processing techniques. The compliant substrates can be used as templates for the growth of various semiconductor structures that include lattice mismatched layers that previously have not been successfully grown on substrates.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes can be made without departing from the spirit and scope of the invention defined in the following claims.

What is claimed is:

1. A compliant substrate, comprising:
   a first single crystal layer;
   an oxidized amorphous buffer layer on the first single crystal layer; and
   a second single crystal layer on the amorphous buffer layer, the second single crystal layer is compliant and has a thickness no greater than about fifteen times a critical thickness of the second single crystal layer.

2. The compliant substrate of claim 1, wherein the second single crystal layer has a thickness that is no greater than about the critical thickness of the second single crystal layer.

3. The compliant substrate of claim 1, wherein the second single crystal layer is sufficiently thin and compliant to deform in response to stress imparted to the second single crystal layer during the epitaxial growth of a lattice mismatched layer on the second single crystal layer.

4. The compliant substrate of claim 1, wherein the second single crystal layer forms a continuous layer on the amorphous buffer layer.

5. The compliant substrate of claim 1, wherein the second single crystal layer comprises a III–V compound.

6. The compliant substrate of claim 5, wherein the III–V compound is selected from the group consisting of GaAs, InGaAs, GaInP, and GaAsSb.

7. The compliant substrate of claim 1, wherein the amorphous buffer layer is formed by:
   forming an intermediate single crystal layer on the first single crystal layer, and
   treating the intermediate single crystal layer to form the amorphous buffer layer which is weakly bonded to the second single crystal layer.

8. The compliant substrate of claim 1, wherein the amorphous buffer layer comprises aluminum and oxygen.

9. The compliant substrate of claim 1, wherein the first single crystal layer and the second single crystal layer each comprise a compound including at least two different elements.

10. The compliant substrate of claim 1, consisting essentially of the first single crystal layer, the amorphous buffer layer and the compliant second single crystal layer.

11. A semiconductor structure, comprising:
    a compliant substrate, including:
    a first single crystal layer;
    an oxidized amorphous buffer layer on the first single crystal layer; and
    a second single crystal layer on the amorphous buffer layer, the second single crystal layer is compliant and has a thickness no greater than about fifteen times a critical thickness of the second single crystal layer; and
    a device selected from the group consisting of electronic devices and optoelectronic devices on the second single crystal layer, the device including at least one lattice mismatched layer formed on the second single crystal layer.

12. The semiconductor structure of claim 11, wherein the second single crystal layer has a thickness that is no greater than about the critical thickness of the second single crystal layer.

13. The semiconductor structure of claim 11, wherein the second single crystal layer is sufficiently thin and compliant to deform in response to stress imparted to the second single crystal layer during the epitaxial growth of a lattice mismatched material on the second single crystal layer.

14. The semiconductor structure of claim 11, wherein the second single crystal layer forms a continuous layer on the amorphous buffer layer.

15. The semiconductor structure of claim 11, wherein the second single crystal layer comprises a III–V compound.

16. The semiconductor device of claim 15, wherein the III–V compound is selected from the group consisting of GaAs, InGaAs, GaInP, and GaAsSb.

17. The semiconductor structure of claim 15, wherein the device comprises at least one GaN layer formed on the second single crystal layer.

18. The semiconductor structure of claim 11 wherein the amorphous buffer layer is formed by:
    forming an intermediate single crystal layer on the first single crystal layer; and
    treating the intermediate single crystal layer to form the amorphous buffer layer which is weakly bonded to the second single crystal layer.

19. The semiconductor structure of claim 11, wherein the amorphous buffer layer comprises aluminum and oxygen.

20. The semiconductor structure of claim 11, wherein the first single crystal layer and the second single crystal layer each comprise a compound including at least two different elements.

21. The semiconductor structure of claim 11, wherein the compliant substrate consists essentially of:
    the first single crystal layer;
    the amorphous buffer layer; and
    the compliant second single crystal layer.

22. The semiconductor structure of claim 11, wherein the device is a photodetector.

23. The semiconductor structure of claim 11, wherein the device is a short-wavelength semiconductor light-emitting device that emits at a light wavelength of less than about 600 nm.

24. The semiconductor structure of claim 11, wherein the device is a long-wavelength semiconductor light-emitting device that emits at a wavelength of from about 1.1 $\mu$m to about 2 $\mu$m.

25. The semiconductor structure of claim 11, wherein the device is an optical modulator.

26. The semiconductor structure of claim 11, wherein the device is a transistor.

27. A process, comprising:

forming an intermediate single crystal layer on a first single crystal layer;

forming a second single crystal layer on the intermediate single crystal layer, the second single crystal layer having a thickness no greater than about fifteen times the critical thickness of the second single crystal layer; and treating the intermediate single crystal layer to form an oxidized amorphous buffer layer which is weakly bonded to the amorphous buffer layer.

28. The process of claim 27, wherein the amorphous buffer layer is formed by forming an intermediate single crystal layer on the first single crystal layer and treating the intermediate single crystal layer to form the amorphous buffer layer, the amorphous buffer layer is weakly bonded to second single crystal layer.

29. The process of claim 28, wherein the treating of the intermediate single crystal layer comprises trenching through the second single crystal layer to the intermediate single crystal layer and oxidizing the intermediate single crystal layer using an oxygen-containing gas.

30. The process of claim 27, wherein the second single crystal layer has a thickness no greater than about the critical thickness of the second single crystal layer.

31. The process of claim 27, wherein the second single crystal layer is formed as a continuous layer on the amorphous buffer layer.

32. The process of claim 27, wherein the second single crystal layer comprises a III–V compound.

33. The process of claim 32, wherein the III–V compound is selected from the group consisting of GaAs, InGaAs, GaInP and GaAsSb.

34. The process of claim 27, wherein the first single crystal layer and the second single crystal layer each comprise a compound including at least two different elements.

35. The process of claim 27, further comprising forming at least one lattice mismatched layer on the second single crystal layer.

36. The process of claim 27, further comprising forming a device selected from the group consisting of electronic devices and optoelectronic devices on the second single crystal layer, the device including at least one lattice mismatched layer formed on the second single crystal layer.

37. The process of claim 36, wherein the device is a photodetector.

38. The process of claim 36, wherein the device is a short-wavelength semiconductor light-emitting device that emits at a wavelength of less than about 600 nm.

39. The process of claim 36, wherein the device is a long-wavelength semiconductor light-emitting device that emits at a wavelength of from about 1.1 $\mu$m to about 2 $\mu$m.

40. The process of claim 36, wherein the device is an optical modulator.

41. The process of claim 36, wherein the device is a transistor.

42. A semiconductor structure, comprising:

a first single crystal layer;

an amorphous buffer layer on the first single crystal layer;

a second single crystal layer on the amorphous buffer layer, the second single crystal layer is compliant and has a thickness no greater than about fifteen times a critical thickness of the second single crystal layer; and at least one GaN layer formed on the second single crystal layer.

43. A compliant substrate, comprising:

a first single crystal layer;

an amorphous buffer layer on the first single crystal layer; and a second single crystal layer on the amorphous buffer layer, the second single crystal layer is compliant and has a thickness no greater than about fifteen times a critical thickness of the second single crystal layer, wherein the amorphous buffer layer is formed by:

forming an intermediate single crystal layer on the first single crystal layer;

forming the second single crystal layer on the intermediate single crystal layer; and treating the intermediate single crystal layer to form the amorphous buffer layer which is weakly bonded to the second single crystal layer.

\* \* \* \* \*